(12) United States Patent
Deltor et al.

(10) Patent No.: US 10,993,355 B2
(45) Date of Patent: Apr. 27, 2021

(54) GROUND STRAP AND METHOD OF GROUNDING A PLURALITY OF ELECTRICALLY CONDUCTIVE MEMBERS THEREWITH

(71) Applicant: Federal-Mogul Powertrain, LLC, Southfield, MI (US)

(72) Inventors: Julien Deltor, Gennevilliers (FR); Melanie Veronneau, Borest (FR); Amelie Simoens, Compiegne (FR); Patrick Thomas, Crepy en Valois (FR); Gaylord Etrillard, Betz (FR)

(73) Assignee: Federal-Mogul Powertrain LLC, Southfield, MI (US)

( * ) Notice: Subject to any disclaimer, the term of this patent is extended or adjusted under 35 U.S.C. 154(b) by 404 days.

(21) Appl. No.: 15/840,514

(22) Filed: Dec. 13, 2017

(65) Prior Publication Data
US 2018/0168078 A1    Jun. 14, 2018

Related U.S. Application Data

(60) Provisional application No. 62/434,225, filed on Dec. 14, 2016.

(51) Int. Cl.
*H01R 43/20* (2006.01)
*H05K 9/00* (2006.01)
(Continued)

(52) U.S. Cl.
CPC .......... *H05K 9/0098* (2013.01); *H01B 9/028* (2013.01); *H01B 11/1091* (2013.01);
(Continued)

(58) Field of Classification Search
CPC ...... H01B 11/1091; H01B 9/028; H02G 1/12; H02G 1/14; H02G 3/0406; H02G 3/32;
(Continued)

(56) References Cited

U.S. PATENT DOCUMENTS

| 4,664,158 A | 5/1987 | Sands |
| 4,684,762 A | 8/1987 | Gladfelter |

(Continued)

FOREIGN PATENT DOCUMENTS

| JP | H07161394 A | 6/1995 |
| JP | 2004335748 A | 11/2004 |
| JP | 2005093198 A | 4/2005 |

OTHER PUBLICATIONS

International Search Report, dated Mar. 28, 2018 (PCT/US2017/066338).

*Primary Examiner* — Paul D Kim
(74) *Attorney, Agent, or Firm* — Robert L. Stearns; Dickinson Wright, PLLC

(57) ABSTRACT

A ground strap for grounding electrical cables for protection against at least one of EMI, RFI or ESD and method of construction thereof is provided. The ground strap has a wall with opposite edges extending along a lengthwise direction between opposite ends. The wall is formed from a plurality of interlaced filaments, with at least some of the plurality of interlaced filaments including a plurality of electrically conductive filaments interlaced in electrical communication with one another.

6 Claims, 4 Drawing Sheets

(51) Int. Cl.

| | |
|---|---|
| *H02G 1/14* | (2006.01) |
| *H02G 1/12* | (2006.01) |
| *H02G 3/04* | (2006.01) |
| *H01B 11/10* | (2006.01) |
| *H01L 23/00* | (2006.01) |
| *H01R 4/66* | (2006.01) |
| *H01R 13/6592* | (2011.01) |
| *H01B 9/02* | (2006.01) |
| *H02G 3/32* | (2006.01) |

(52) U.S. Cl.
 CPC ............... *H01L 24/36* (2013.01); *H01R 4/66* (2013.01); *H01R 13/6592* (2013.01); *H02G 1/12* (2013.01); *H02G 1/14* (2013.01); *H02G 3/0406* (2013.01); *H05K 9/009* (2013.01); *H05K 9/0079* (2013.01); *H02G 3/32* (2013.01)

(58) Field of Classification Search
 CPC .... H05K 9/0079; H05K 9/009; H05K 9/0098; H01L 24/36; H01R 4/66; H01R 13/6592
 See application file for complete search history.

(56) References Cited

U.S. PATENT DOCUMENTS

| | | | |
|---|---|---|---|
| 5,209,964 A | 5/1993 | Nakagawa | |
| 5,281,762 A | 1/1994 | Long et al. | |
| 5,473,117 A | 12/1995 | Morgan et al. | |
| 6,031,185 A | 2/2000 | Bouveret et al. | |
| 6,111,194 A * | 8/2000 | Kroulik | F16L 57/06 138/128 |
| 6,328,080 B1 * | 12/2001 | Winters | D03D 19/00 138/168 |
| 6,639,148 B2 | 10/2003 | Marks | |
| 8,367,182 B2 | 2/2013 | Rodrigues et al. | |
| 9,307,685 B2 * | 4/2016 | Harris | H05K 9/009 |
| 10,358,765 B2 * | 7/2019 | Laurent | D04B 21/20 |
| 10,542,645 B2 * | 1/2020 | Simoens-Seghers | H05K 9/0067 |
| 2010/0084179 A1 | 4/2010 | Harris et al. | |
| 2010/0212952 A1 * | 8/2010 | Abdelmoula | H01B 1/026 174/390 |
| 2016/0021799 A1 | 1/2016 | Harris et al. | |

\* cited by examiner

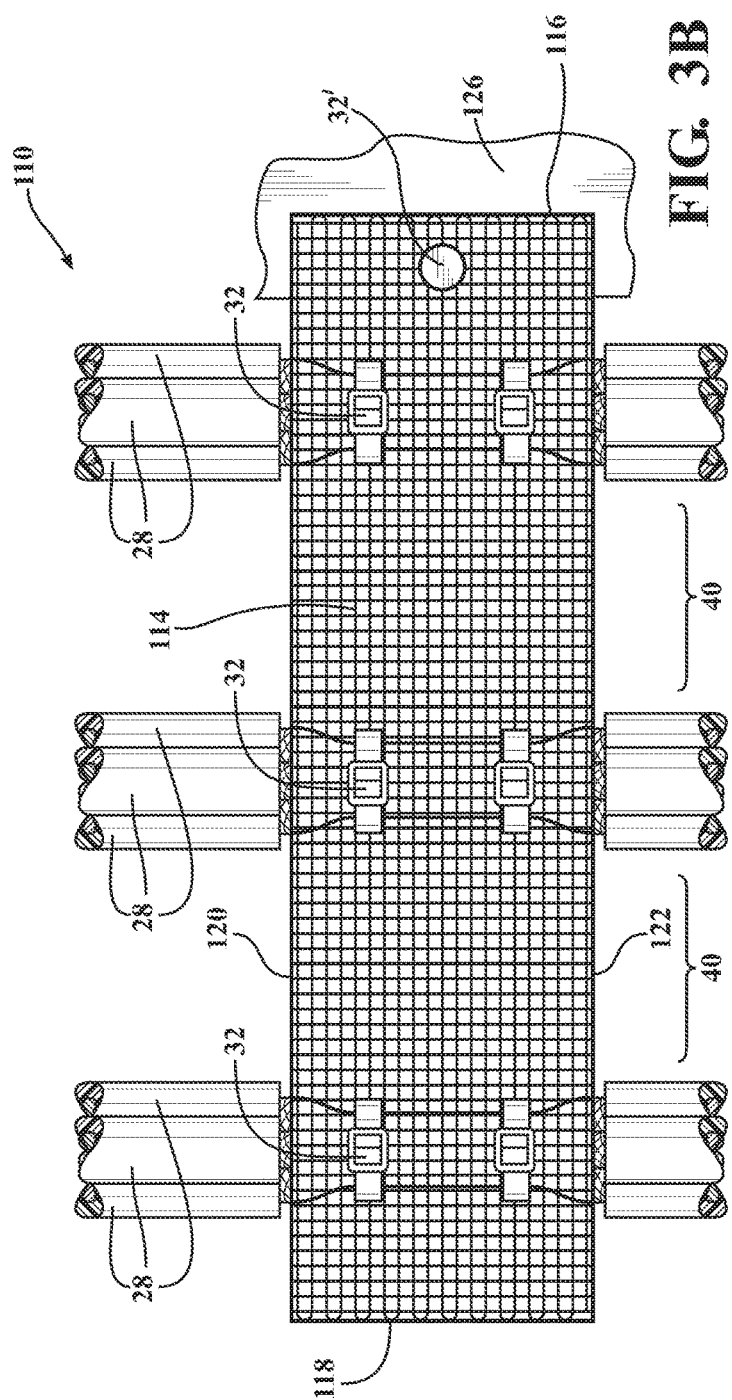
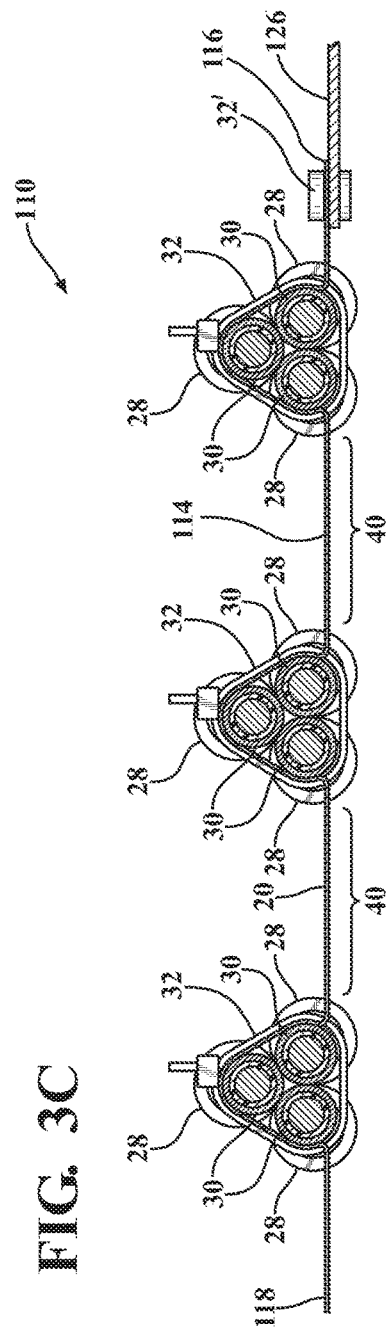

GROUND STRAP AND METHOD OF GROUNDING A PLURALITY OF ELECTRICALLY CONDUCTIVE MEMBERS THEREWITH

CROSS-REFERENCE TO RELATED APPLICATION

This application claims the benefit of U.S. Provisional Application Ser. No. 62/434,225, filed Dec. 14, 2016, which is incorporated herein by reference in its entirety.

BACKGROUND OF THE INVENTION

1. Technical Field

This invention relates generally to electrically conductive members, and more particularly to ground members for bringing a plurality of electrically conductive members to a common grounded potential with one another.

2. Related Art

It is known that electromagnetic interference (EMI), radio frequency interference (RFI), and electrostatic discharge (ESD) pose a potential problem to the proper functioning of electronic components caused by interference due to inductive coupling between nearby electrically conductive members and propagating electromagnetic waves. For example, electrical currents in electrically conductive members associated with an electrical power system in a vehicle, including trains, automobiles, or other any other type of vehicle, may induce spurious signals in various electronic components. Such interference could downgrade the performance of control modules or other electrical components in the vehicle, thereby causing the vehicle to act other than as desired.

It is known to ground individually shielded conductive members, such as shielded cables or wires, by removing a localized section of an outer insulation shield, known as a sheath, from each conductive member to be grounded, and then solder a separate ground member to each exposed conductive member, with the separate ground members then being individually routed to a source of ground. In some applications, such as a train application, the grounding must be performed at least at each of the opposite ends of the conductive member, and preferably about every meter along the length of the conductive member, and thus, the endeavor of soldering the separate ground members to each conductive member becomes very laborious and potentially hazardous. Soldering requires application of high heat on a local section which can both present risk to the operator and potential damage to the conductive members not rated at the temperature required for soldering. Further yet, over the life and use of the vehicle, vibrations and impact shocks affect the integrity of the solder joint, thereby presenting a possible source of inadvertent disconnection. Accordingly, although soldering individual ground members to individual conductive members can prove effective initially, it is time consuming, costly, potentially hazardous, and subject to degradation over the useful life of the application.

A grounding member manufactured in accordance with the present invention overcomes or greatly minimizes at least those limitations of the known mechanism for ground individual electrical cables described above and achieves desired goals of improving the ease with which to ground conductive members, such as shielded electrical cables and wires, thereby greatly reducing the labor and cost associated therewith, among other benefits as will be readily recognized by one skilled in the art upon viewing the disclosure herein.

SUMMARY OF THE INVENTION

A ground strap for grounding electrical cables for protection against at least one of EMI, RFI or ESD is provided. The ground strap has a wall with opposite edges extending along a lengthwise direction between opposite ends. The wall is formed from a plurality of interlaced filaments, with at least some of the plurality of interlaced filaments including a plurality of electrically conductive filaments interlaced in electrical communication with one another. At least one elongate fixation member is configured to maintain the wall in electrical communication with the electrical member.

In accordance with another aspect, at least some of the plurality of electrically conductive filaments are warp filaments extending along the lengthwise direction and at least some of the plurality of electrically conductive filaments are weft filaments extending transversely to the lengthwise direction.

In accordance with another aspect, at least some of the plurality of interlaced filaments includes a plurality of heat-set filaments extending along the lengthwise direction, with the heat-set filaments biasing the opposite ends into overlapping relation with one another.

In accordance with another aspect, the at least one elongate fixation member includes a plurality of elongate fixation members extending through the wall, with the plurality of elongate fixation members being spaced from one another along the lengthwise direction.

In accordance with another aspect, an elongate ground conductive member can be coupled to the wall via the at least one elongate fixation member, with the elongate conductive member being configured for attachment to a source of ground.

In accordance with another aspect, a method of grounding a plurality of electrical members for protection against at least one of EMI, RFI or ESD is provided. The method includes removing a section of an outer insulation sheath from each of the electrical members to form exposed regions on each of the electrical members. Then, placing an interlaced wall of conductive filaments over the exposed regions to bring the interlaced wall into electrical communication with the electrical members. Further, operably coupling the interlaced wall in electrical communication with the electrical members.

In accordance with another aspect, the method can further include coupling an elongate ground conductive member to the interlaced wall and fixing the elongate conductive ground member to a source of ground.

In accordance with another aspect, the method can further include bundling a plurality of the electrical members in bundled abutment with one another and wrapping the interlaced wall of conductive filaments circumferentially about the exposed regions of the abutting electrical members to bring opposite ends of the interlaced wall into overlapping relation with one another.

In accordance with another aspect, the method can further include providing the interlaced wall having heat-set filaments biasing the opposite ends into overlapping relation with one another.

In accordance with another aspect, the method can further include fixing a tie wrap about the interlaced wall to maintain the opposite ends of the interlaced wall in overlapping relation with one another.

In accordance with another aspect, the method can further include coupling the interlaced wall in electrical communication with the electrical members and coupling an elongate conductive member to the interlaced wall with a common fastener.

In accordance with another aspect, the method can further include providing a plurality of the electrical members extending in laterally spaced, parallel relation with one another and bridging the plurality of electrical members with the interlaced wall of conductive filaments to bring the plurality of electrical members into electrical communication with one another to establish a common electrical potential between the plurality of electrical members.

In accordance with another aspect, the method can further include providing the plurality of electrical members as a plurality of separate bundles of electrical members in laterally spaced relation with one another and bridging the plurality of bundles with the interlaced wall of conductive filaments to bring the plurality of bundles into electrical communication with one another to establish a common electrical potential between the plurality of bundles.

In accordance with another aspect, the method can further include fixing each of the separate bundles of electrical members to the interlaced wall with separate fasteners.

In accordance with another aspect, the method can further include piercing the interlaced wall with the fasteners and cinching the fasteners about the electrical members to bring the electrical members to a common potential with the interlaced wall and with one another.

BRIEF DESCRIPTION OF THE DRAWINGS

These and other features and advantages will become readily apparent to those skilled in the art in view of the following detailed description of the presently preferred embodiments and best mode, appended claims, and accompanying drawings, in which:

FIG. 3B is a bottom plan view of the ground strap and electrical members of FIG. 3A; and FIG. 3C is a cross-sectional view taken generally along the line 3C-3C of FIG. 3B.

DETAILED DESCRIPTION OF PREFERRED EMBODIMENTS

Figure 1A:
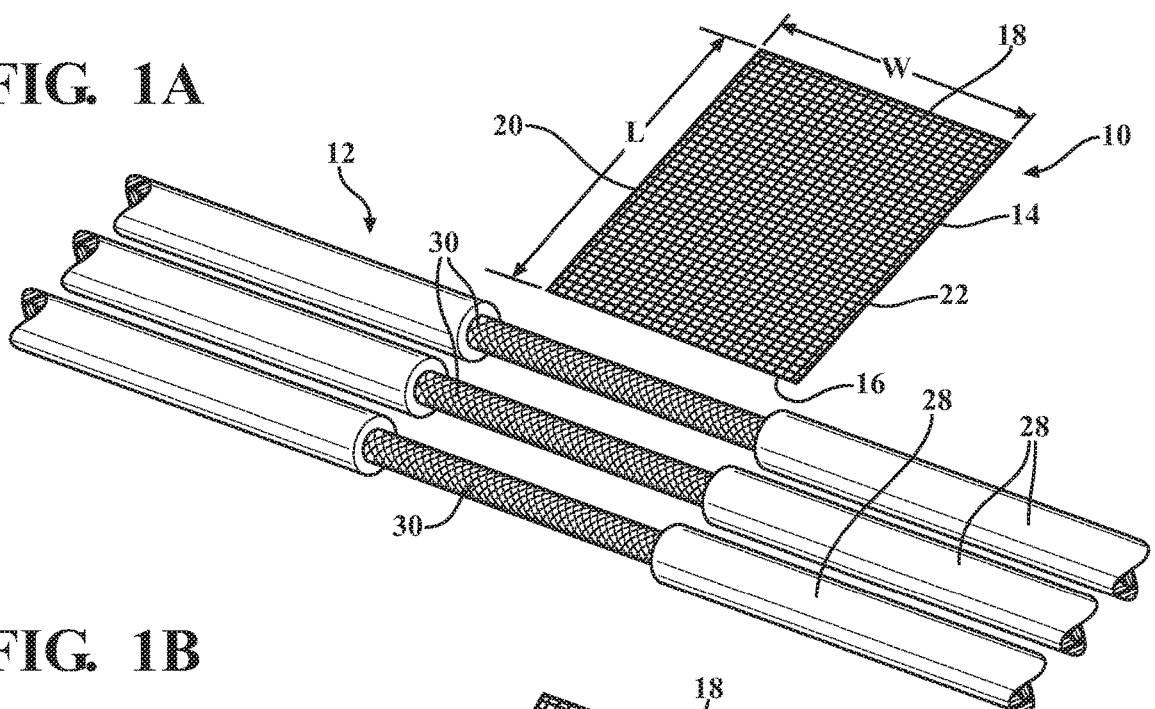
FIG. 1A is a perspective view of a ground strap constructed in accordance with one presently preferred embodiment of the disclosure shown exploded from electrical members prior to being wrapped thereabout to be protect the electrical members against at least one of EMI, RFI or ESD.

Referring in more detail to the drawings, FIGS. 1A-1E show a ground strap 10 constructed in accordance with presently preferred aspects of the disclosure. The ground strap 10 is configured to be wrapped about a plurality of conductive electrical members, shown, by way of example and without limitation as conductive electrical wire(s) or cables 12 to be protected against at least one of EMI, RFI or ESD. The ground strap 10 has a wall 14 with opposite edges 20, 22 extending between opposite ends 16, 18 (FIG. 1A). The opposite ends 16, 18 are configured to be wrapped into overlapping relation with one another to bound the plurality of electrical cables 12 in a circumferentially enclosed cavity 24. The wall 14 is formed, at least in part, by a plurality of electrically conductive filaments (monofilaments and/or multifilaments), also referred to as yarns, interlaced in electrical communication with one another, such that upon operably coupling the electrically conductive yarns to a source of ground 26, the electrical cables 12 are protected against at least one of EMI, RFI or ESD.

Figure 1B:
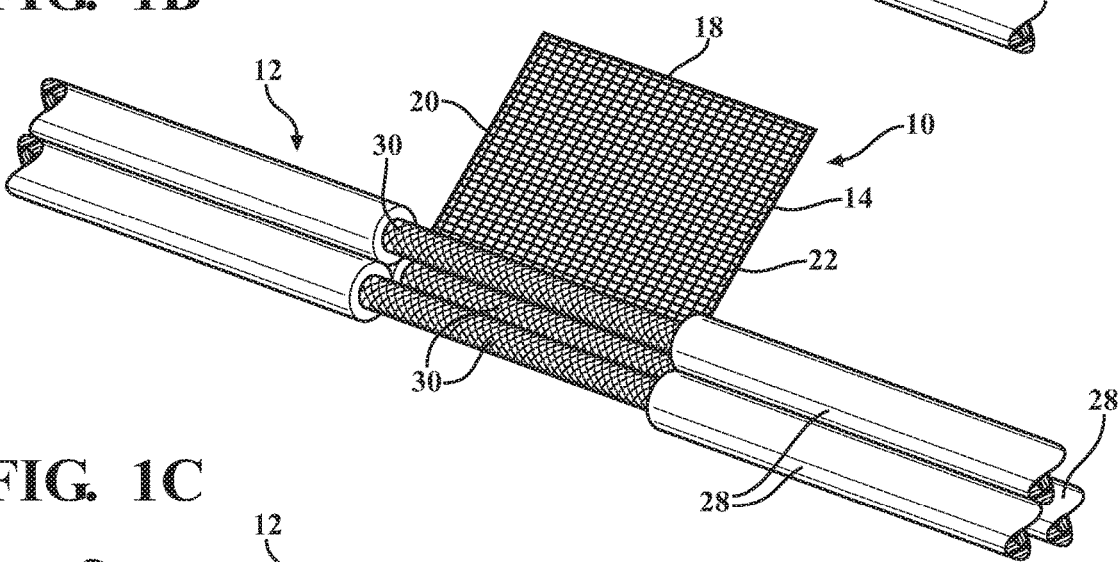
FIG. 1B is view similar to FIG. 1A showing the ground strap being wrapped about the electrical members of FIG. 1A.
Figure 1C:
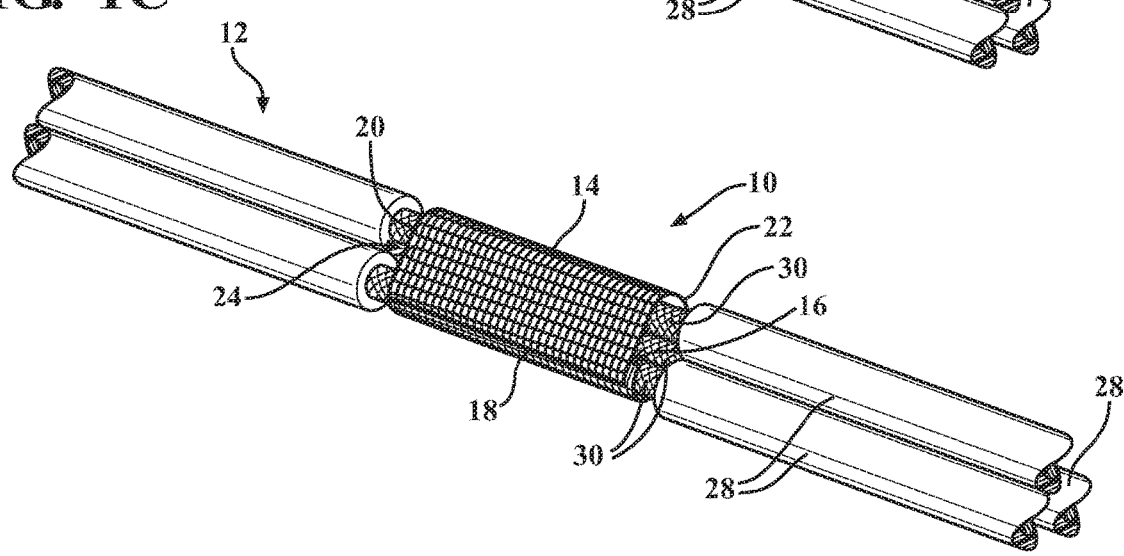
FIG. 1C is a view similar to FIG. 1B showing the ground strap wrapped about the electrical members.
Figure 1D:
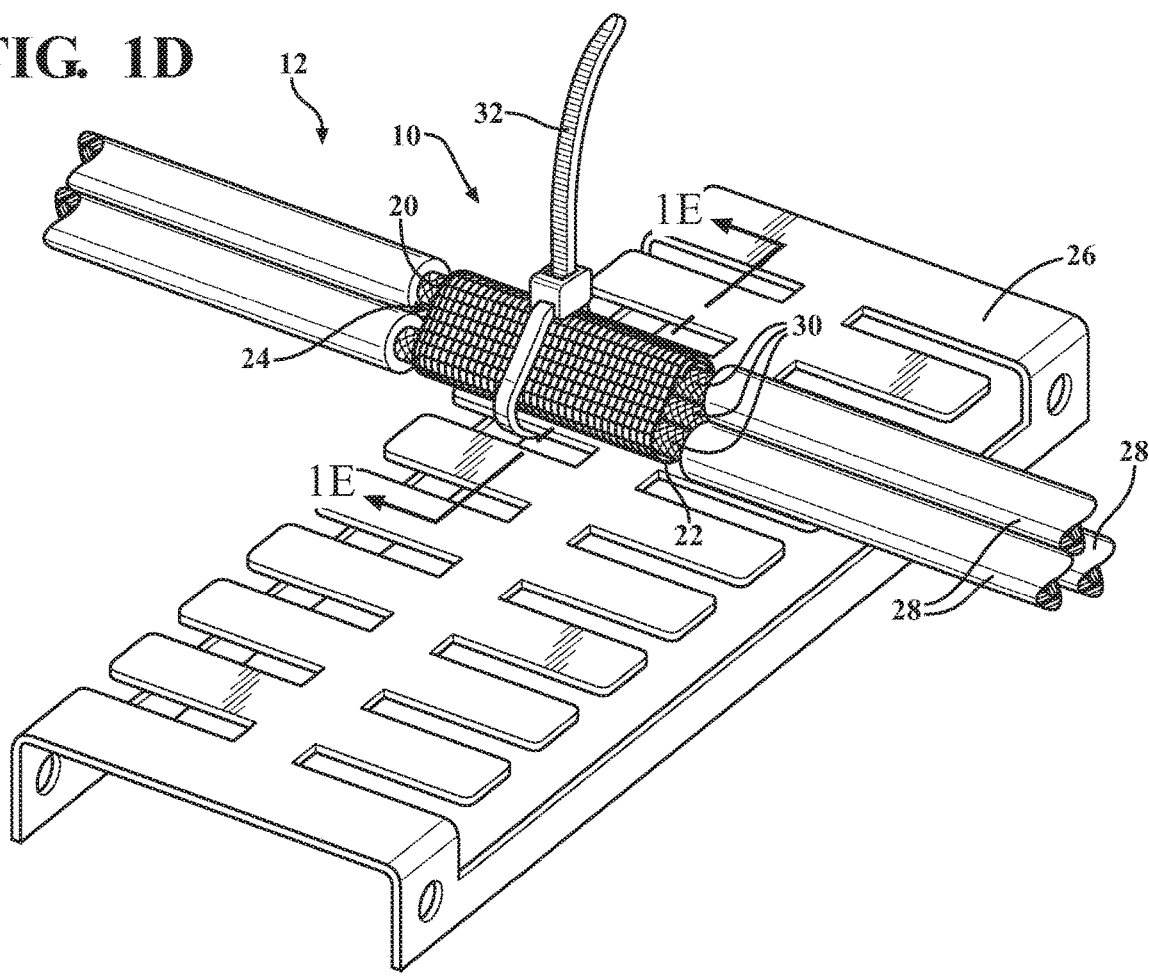
FIG. 1D is a perspective view of the ground strap and electrical members of FIG. 1C shown attached to a source of ground.
Figure 1E:
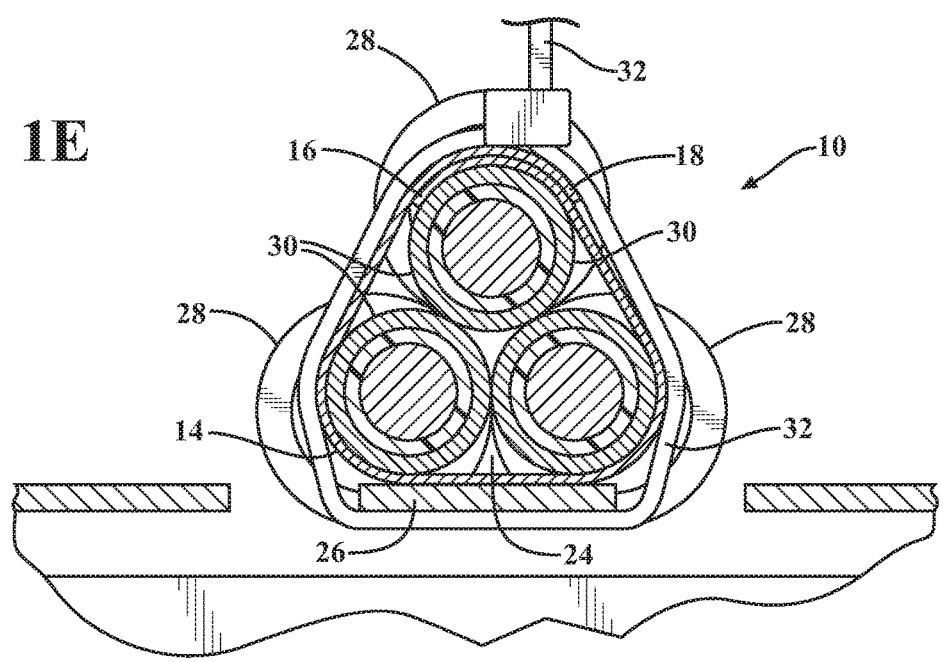
FIG. 1E is a cross-sectional view taken generally along the line 1E-1E of FIG. 1D.

To optimally protect the electrical cables against EMI, RFI and/or ESD, a select portion of an outer insulative sheath 28 of each electrical cable 12 is first removed to expose the inner conductive wire(s), cable or shielding screen, referred to hereafter as shielding 30 (FIG. 1A), and then, as shown in FIG. 1B, the ground strap 10 is wrapped about the exposed conductive shielding 30 such that ground strap 10 is brought into electrical communication with each shielding 30. To more fully protect the electrical cables 12, as shown in FIG. 1C, the opposite ends 16, 18 of the ground strap 10 are brought into overlapping relation with one another, thereby fully encircling the shielding 30 of the conductive cables 12. Then, as shown in FIGS. 1D and 1E, if desired, the ground strap 10 can be operably attached for electrical communication with the source of ground 26, and as shown, can be attached in direct abutment to the source of ground 26. In the embodiment shown, a fastener, such as a tie wrap 32 or the like can be used to fix the ground strap 10 and electrical cables 12 contained therein directly to the source of ground 26 and to bring the respective shieldings 30 of the cables 12 into tight abutment with one another, thereby establishing good electrical communication therebetween.

The wall 14 can be interlaced via any suitable mechanism, including braiding, knitting, and preferably weaving. Regardless, at least some or the entirely of the yarns used, including monofilaments and/or multifilaments, can be provided as electrically conductive filaments, such as metallic coated yarns, metal wires and hybrid yarns including nonconductive filaments served or twisted with conductive filaments, such as disclosed in commonly owned U.S. Pat. No. 8,283,563, issued on Oct. 9, 2012, which is incorporated herein by way of reference in its entirety. Further yet, it is contemplated that heat-settable yarn(s) could be interlaced in the wall 14, such as a warp yarn extending lengthwise from one end 16 to the opposite end 18 in a woven, knit or braided construction, to allow the wall 14 to be heat-set into a self-wrapping wall 14 such that the opposite edges 16, 18 are automatically biased into overlapping relation with one another. It is to be recognized that the wall 14 is constructed as a flat tape or strip, referred to as strap, wherein the length (L) of the wall 14 is defined by the warp direction extending between the opposite ends 16, 18, and wherein the width (W) of the wall 14 is defined by a weft direction extending between the opposite edges 20, 22. Accordingly, the wall 14 can be made in a continuous interlacing process, and depending on the application, the length of the wall 14 can be cut to a predetermined length, as necessary. Of course, the edges 20, 22 are formed in the interlacing process so as to not have loose yarns or cut ends, and thus, are free from unwanted fray.

Figure 2:
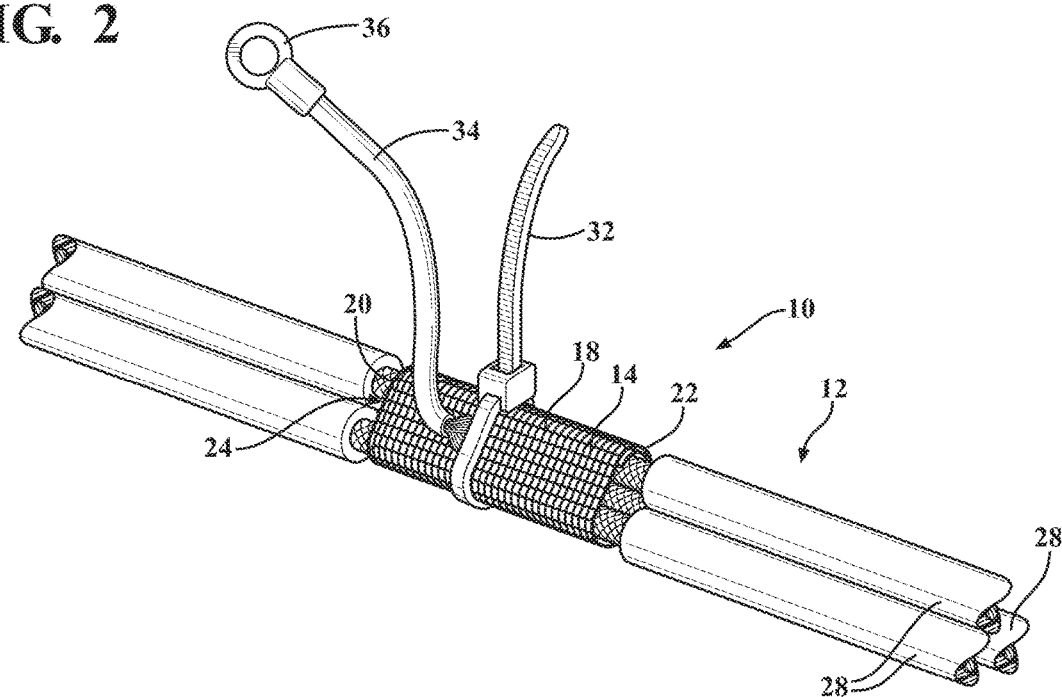
FIG. 2 is a view similar to FIG. 1C showing a ground strap constructed in accordance with another aspect of the disclosure with a ground member coupled thereto via a fastener for attachment of the ground member to a source of ground remote from the ground strap and electrical members contained therein.

In accordance with another aspect of the invention, as shown in FIG. 2, a ground member 34 can be configured to extend from electrical communication with the wall 14 to the source of ground 26. This is of particular benefit if the source of ground 26 is remote from the cables 12. The ground member 34 can be fixed in electrical communication with the shieldings 30, such as by being captured in sandwiched relation between the fastener 32 and the wall 14, wherein a free end 36 of the ground member 34 is configured for attachment to the source of ground 26.

The ground member 34 can be provided as a wire material as desired for the intended application, such as twisted round wires, braided round wires, flat wires, and can include a tin coated copper or nickel coated copper material, by way of example and without limitation, and can be provided having any desired diameter and length. The ground member 34 can be operably attached to the wall 14 via the tie wrap 32, or the ground member 34 can otherwise be interlaced with the yarns of the wall 14. If interlaced with the wall 14, the ground member 34 is extendible from the end 18 for a predetermined distance sufficient for attachment to the source of ground 26.

Figure 3A:
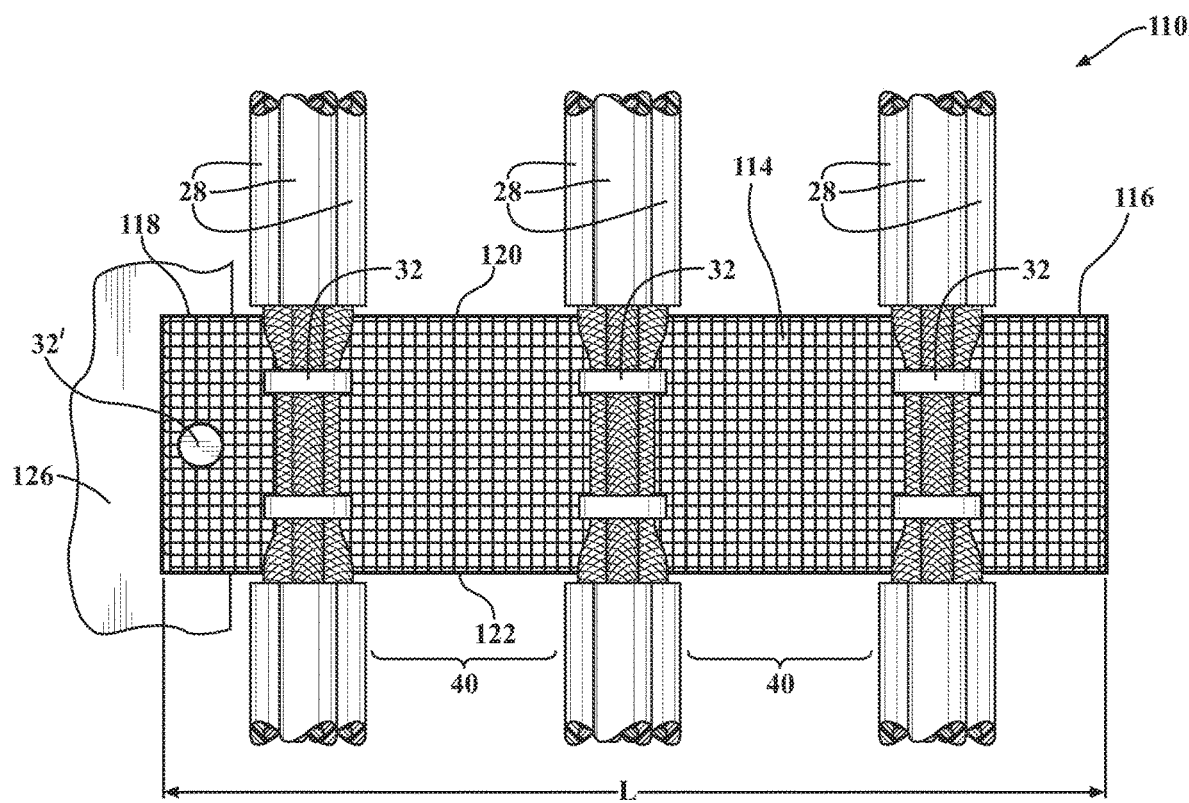
FIG. 3A is a top plan view of a ground strap constructed in accordance with another aspect of the disclosure shown coupled to a plurality of electrical members to bring the electrical members to a common electrical potential with one another.

As shown in FIGS. 3A-3C, a ground strap 110 constructed in accordance with a further presently preferred aspect of the disclosure is shown, wherein the same reference numerals as used above, offset by a factor of 100, are used to identify like features. The ground strap 110 has a wall 114 with opposite edges 120, 122 extending between opposite ends 116, 118 (FIGS. 3A and 3B). The wall 114 is as discussed above, having at least in part, a plurality of electrically conductive filaments (monofilaments and/or multifilaments), also referred to as yarns, interlaced in electrical communication with one another, such that upon operably coupling the electrically conductive yarns to a source of ground 126, the electrical members 12 are protected against at least one of EMI, RFI or ESD.

The wall 114 is constructed as a flat tape or strip, referred to as strap, wherein the length (L) of the wall 114 is defined by the warp direction extending between the opposite ends 116, 118. The wall 114, rather than being wrapped circumferentially about the cables 12, is configured to be placed into conductive, tangential or substantially tangential abutment (meaning that the wall 114 can extend partially about a segment of the wall, but it would be recognized as being in tangential relation and not wrapped relation with the cables 12) with shielding 30 of the cables 12, such as via removal of a portion of the insulative sheath 28, as discussed above. As shown, a plurality of the electrical members 12 extend in laterally spaced, parallel relation with one another, wherein the strap 110 is strategically placed to bridge over the exposed shieldings 30 to bring the plurality of laterally spaced electrical members 12 into electrical communication with one another to establish a common electrical potential between the plurality of electrical members 12. The electrical members 12 can be fixed to the interlaced wall 114 with separate fasteners, such as tie wraps 32, by way of example and without limitation, as discussed above, via piercing the through the wall 114 on opposite sides of the electrical members 12 and then cinching the fastener 32 to itself to bring the electrical member 12 into abutting, tangential relation and/or partially wrapped (FIG. 3C) configuration with the fastener 132 about a portion of the wall 114. As a result of cinching the fastener 132, a portion of the wall 114 can be arched about an arcuate path about the plurality of electrical members 12, with the remaining portions of the wall 114 extending in coplanar or substantially coplanar relation with one another to form the bridge sections 40. Further yet, the wall 114 can be fixed to a source of ground 126 via a fastener 32' disposed through the wall 114 and fixed to the source of ground 126.

Obviously, many modifications and variations of the present invention are possible in light of the above teachings. It is contemplated that all features of all claims and of all embodiments can be combined with each other, so long as such combinations would not contradict one another. It is, therefore, to be understood that within the scope of the appended claims, the invention may be practiced otherwise than as specifically described.

What is claimed is:

1. A ground strap assembly for grounding an electrical member against at least one of electromagnetic interference (EMI), radio frequency interference (RFI) or electrostatic discharge (ESD), comprising:
    a flat wall having opposite edges extending along a lengthwise direction between opposite ends, said wall being formed from a plurality of interlaced filaments, at least some of said plurality of interlaced filaments including a plurality of electrically conductive filaments interlaced in electrical communication with one another; and
    at least one elongate fixation member piercing through said plurality of interlaced filaments of said wall and being configured to maintain said wall in electrical communication with the electrical member,
    wherein said at least one elongate fixation member is configured to maintain said flat wall in substantially tangential abutment with the electrical member and in electrical communication with the electrical member.

2. The ground strap assembly of claim 1, wherein at least some of said plurality of electrically conductive filaments are warp filaments extending along said lengthwise direction and at least some of said plurality of electrically conductive filaments are weft filaments extending transversely to said lengthwise direction.

3. The ground strap assembly of claim 1, wherein said at least one elongate fixation member includes a plurality of elongate fixation members piercing through said wall, said plurality of elongate fixation members being spaced from one another along the lengthwise direction.

4. The ground strap assembly of claim 1, further comprising an elongate conductive member coupled to said wall via said at least one elongate fixation member.

5. The ground strap assembly of claim 4, wherein said elongate conductive member is braided.

6. A flat ground strap assembly for grounding at least one electrical member against at least one of electromagnetic interference (EMI), radio frequency interference (RFI) or electrostatic discharge (ESD), comprising:
    a flat wall having opposite edges extending along a lengthwise direction between opposite ends, said wall being formed from a plurality of interlaced filaments, at least some of said plurality of interlaced filaments including a plurality of electrically conductive filaments interlaced in electrical communication with one another; and at least one elongate fixation member piercing through said wall and being configured to maintain said flat wall in substantially tangential abutment with the at least one electrical member and in electrical communication with the at least one electrical member, wherein said at least one elongate fixation member comprises a plurality of elongate fixation members piercing through said wall and being configured to maintain said flat wall in substantially tangential abutment with a plurality of the at least one electrical member and in electrical communication with the plurality of electrical members, wherein the plurality of electrical members are maintained in spaced relation from one another by the plurality of elongate fixation members.

* * * * *